United States Patent
Yoon

(10) Patent No.: US 6,222,401 B1
(45) Date of Patent: Apr. 24, 2001

(54) PHASE LOCKED LOOP USING GEAR SHIFTING ALGORITHM

(75) Inventor: Young-Bin Yoon, Kyungki-Do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/265,402

(22) Filed: Mar. 10, 1999

(30) Foreign Application Priority Data

Mar. 17, 1998 (KR) .................................................. 98-9081

(51) Int. Cl.[7] ............................................................ H03L 7/06
(52) U.S. Cl. .............................................. 327/156; 327/157
(58) Field of Search .................................... 327/147, 148, 327/156, 157; 331/15, 16, 17

(56) References Cited

U.S. PATENT DOCUMENTS

| | | | |
|---|---|---|---|
| 5,475,326 | * 12/1995 | Masuda | 327/157 |
| 5,502,411 | * 3/1996 | Matsuki | 327/156 |
| 5,592,120 | * 1/1997 | Palmer et al. | 327/536 |
| 5,767,736 | * 6/1998 | Lakshmikumar et al. | 327/536 |
| 5,783,972 | * 6/1998 | Nishikawa | 331/17 |
| 5,818,287 | * 10/1998 | Chow | 327/536 |
| 5,886,551 | * 3/1999 | Narahara | 327/157 |

* cited by examiner

Primary Examiner—Toan Tran
Assistant Examiner—Linh Nguyen

(57) ABSTRACT

A phase locked loop (PLL) using a gear shifting algorithm, includes a phase detector comparing phases of an external clock signal and a feedback internal clock signal, a gear shifting control unit outputting a plurality of control signals according to a programmed variable loop gain sequence and an output signal from the phase detector, a charge pump controlling a loop gain of a pumping voltage according to the plurality of control signals, a loop filter filtering an output signal from the charge pump, and a voltage controlled oscillator controlling a frequency of the second clock signal according to an output signal from the loop filter.

13 Claims, 3 Drawing Sheets

PHASE LOCKED LOOP USING GEAR SHIFTING ALGORITHM

BACKGROUND OF THE INVENTION

1. Field of the Invention

The present invention relates to a phase locked loop (PLL), and in particular to a phase locked loop using a gear shifting algorithm.

2. Description of the Background Art

In general, a clock signal generating circuit provides a high-speed memory chip with an internal clock signal generated by delaying an external clock signal for a predetermined time. However, as a semiconductor memory device has been developed, the memory chips are operated at a higher speed, and there are limitations to delay the external clock signal. Accordingly, a high-performance integrated circuit commonly employs a phase locked loop (PLL) or delay locked loop (DLL) in order to obtain the internal clock signal.

FIG. 1 is a block diagram illustrating a conventional phase locked loop (PLL). In FIG. 1, the conventional PLL includes a phase detector 10, a charge pump 11, a loop filter 12 and a voltage controlled oscillator (VCO) 13.

The phase detector 10 detects a phase difference between the external clock signal CLKX and the feedback internal clock signal CLKI, and is embodied as an exclusive OR gate XOR and JK flip-flop. The charge pump 11 carries out a pumping operation according to phase difference signals UP, DN outputted from the phase detector 10. The loop filter 12 filters an output signal from the charge pump 11, and outputs a control voltage CV to the VCO 13.

The operation of the conventional analog PLL will now be described.

The phase detector 10 compares the phases of the two clock signals CLKX, CLKI, and outputs the phase difference signal DN when the phase of the internal clock signal CLKI is faster than that of the external clock signal CLKX, and outputs the phase difference signal UP when the phase of the internal clock signal CLKI is slower than that of the external clock signal CLKX. The charge pump 11 performs a pumping operation according to the phase difference signal DN or UP outputted from the phase detector 10. The loop filter 12 filters the output signal from the charge pump 1, and outputs a control voltage CV to control an output frequency of the VCO 13.

The VCO 13 controls a frequency of the internal clock signal CLKI according to the control voltage CV, and the internal clock signal CLKI with its frequency controlled is fed back to the phase detector 10. Thus, the conventional PLL repeatedly carries out the above-described operation until the internal clock signal CLKI and the external clock signal CLKX have an identical phase (until locked). When the internal clock signal CLKI is locked to the external clock signal CLKX, the locked internal clock signal CLKI is used as a clock signal for the timing restoration of the integrated circuit, namely the internal circuit.

In general, the PLL must have properties such as a short locking time and a low jitter. However, in the conventional PLL, it takes a remarkably long time to generate the locked internal clock signal CLKI. There is another disadvantage of the conventional PLL in that the jitter is more generated due to the phase difference between the external clock signal CLKX and the internal clock signal CLKI.

SUMMARY OF THE INVENTION

Accordingly, it is an object of the present invention to provide a phase locked loop (PLL) having the properties of the short locking time and low jitter by using a gear shifting algorithm.

In order to achieve the above-described object of the present invention, there is provided a phase locked loop (PLL) including a phase detector comparing phases of an external clock signal and a feedback internal clock signal, a gear shifting control unit outputting a plurality of control signals according to a programmed variable loop gain sequence and an output signal from the phase detector, a charge pump controlling a loop gain of a pumping voltage according to the plurality of control signals, a loop filter filtering an output signal from the charge pump, and a voltage controlled oscillator (VCO) controlling a frequency of the internal clock signal according to the output signal from the loop filter.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

Figure 2:
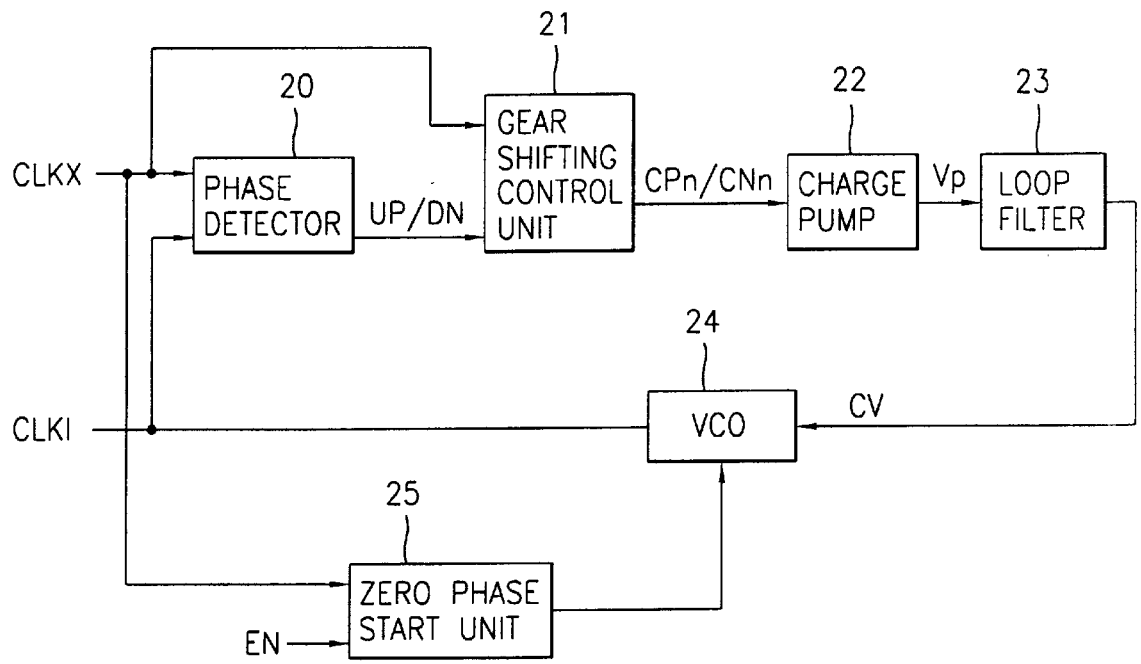
FIG. 2 is a block diagram illustrating a phase locked loop using a gear shifting algorithm according to the present invention.

As illustrated in FIG. 2, a phase locked loop using a gear shifting algorithm according to the present invention includes: a phase detector 20, a gear shifting control unit 21, a charge pump 22, a loop filter 23, a voltage controlled oscillator (VCO) 24 and a zero phase start unit 25.

Figure 1:
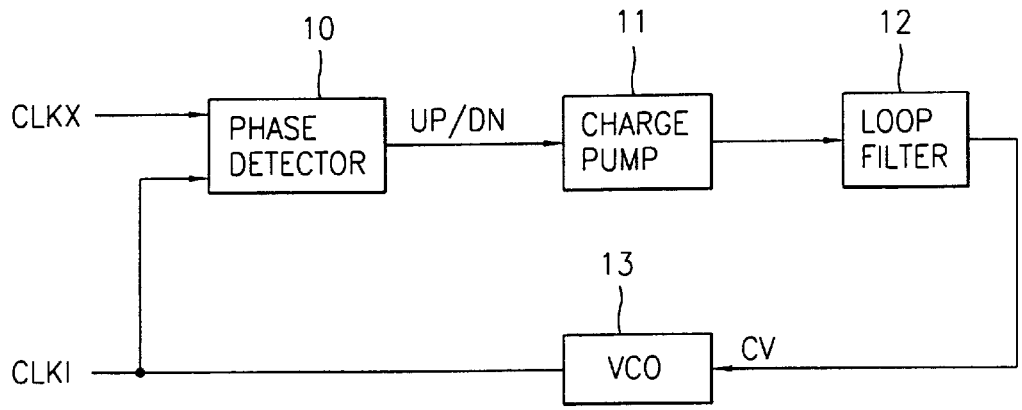
FIG. 1 is a block diagram illustrating a conventional phase locked loop.

The phase detector 20, the loop filter 23 and the VCO 24 are identical in constitution and operation to the phase detector 10, the loop filter 12 and the VCO 13 illustrated in FIG. 1.

The gear shifting control unit 21 is synchronized by an external clock signal CLKX, and outputs a plurality of control signals (CPn),(CNn)(n=0,1,2,3, . . . ) to control the charge pump 22 according to phase difference signals UP, DN outputted from the phase detector 20.

Figure 3:
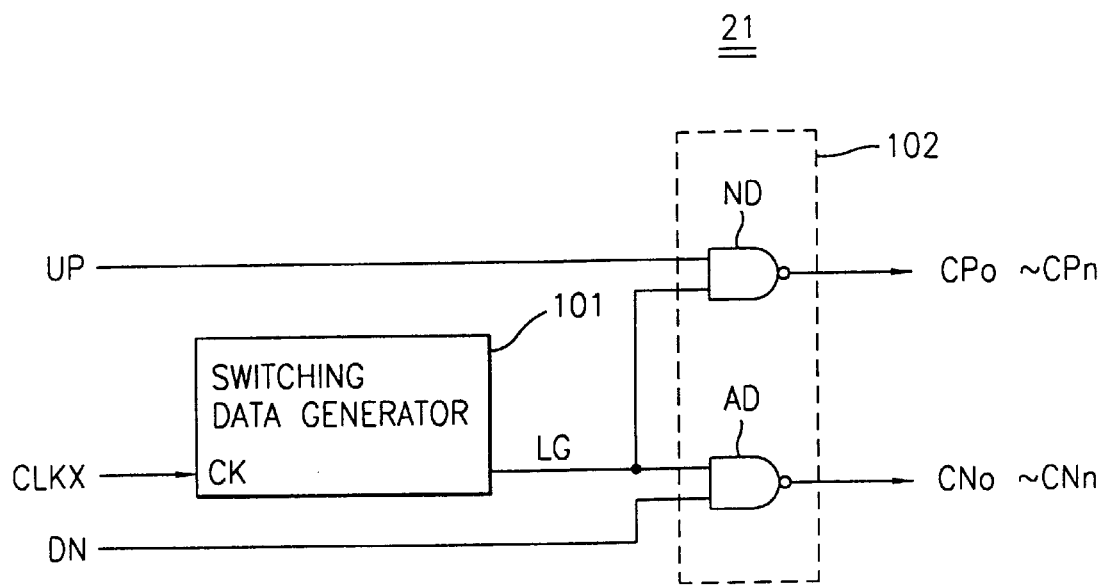
FIG. 3 is a detailed block diagram illustrating a gear shifting control unit in FIG. 2.

As depicted in FIG. 3, the gear shifting control unit 21 includes: a switching data generator 101 writing/reading a variable loop gain sequence according to the external clock signal, and a combination logic 102 performing an operation of the loop gain sequence read in the switching data generator 101 and phase difference signals UP, DN of the charge pump 22, and outputting a plurality of control signals. Here, the switching data generator 101 consists of a RAM, and the combination logic 102 includes a NAND gate (ND) NANDing the phase difference signal UP and the loop gain sequence, and an AND gate (AD) ANDing the phase difference signal DN and the loop gain sequence.

The charge pump 22 consists of n pairs of pumps (1~n) where the plurality of control signals (CPn),(CNn) are each respectively inputted. Each pair of pumps (1~n) includes a first current source and PMOS transistor P connected in series between a power voltage Vcc and an output node 50, and an NMOS transistor N and a second current source connected in series between the output node 50 and a ground voltage Vss. The control signal CPn is inputted into a gate of the PMOS transistor P, and the control signal CNn is inputted into a gate of the NMOS transistor N. In addition, the first and second current sources have an identical current value in each pump pair (1~n). The first and second current sources of the second pair of pumps 2 have a greater current value than the first and second current sources of the first pair of pumps 1 by two times. Identically, the first and second current sources of a specific pair of pumps have a greater current value than those of a preceding pair of pumps by two times. However, the present invention is not limitative, and thus the first and second current sources may be embodied as a turned-on MOS transistor.

The zero phase start unit 25 is operated by an enable signal EN, and controls the VCO 24 according to the external clock signal CLKX, thereby controlling an initial phase of the internal clock signal CLKI.

The operation of the phase locked loop according to the present invention will now be described with reference to the accompanying drawings.

First, an user programs an optimum shifting loop gain sequence in the gear shifting control unit 21 in a programming mode. That is, the optimum gear shifting loop gain sequence is programmed in the switching data generator 101 synchronized by the external clock signal CLKX.

Thereafter, in a locking mode, the user applies the external clock signal CLKX to the PLL, and activates the enable signal EN, thereby operating the zero phase start unit 25. As a result, the zero phase start unit 25 is synchronized by the external clock signal CLKX, and thus controls the initial phase of the internal clock signal CLKI outputted to the VCO. The phase detector 20 compares the phase of the external clock signal CLKX with the phase of the internal clock signal CLKI with its initial phase controlled, and then outputs the phase difference signal DN when the phase of the internal clock signal CLKI is faster than the phase of the external clock signal CLKX, and outputs the phase difference signal UP when the phase of the internal clock signal CLKI is slower than that of the external clock signal CLKX.

The gear shifting control unit 21 outputs the plurality of control signals (CPn),(CNn) (n=0,1,2,3, ... ) to control the pumping operation of the charge pump 22 according to the phase difference signal UP or DN outputted from the phase detector 20 and the programmed loop gain sequence. The switching data generator 101 of the gear shifting control unit 21 outputs a programmed loop gain LG according to the external clock signal. The combination logic 102 performs a logic operation of the loop gain LG and the phase difference signal UP, and outputs the control signal CPn or CNn to operate a specific pair of pumps among the n pairs of pumps (1~n).

Figure 4:
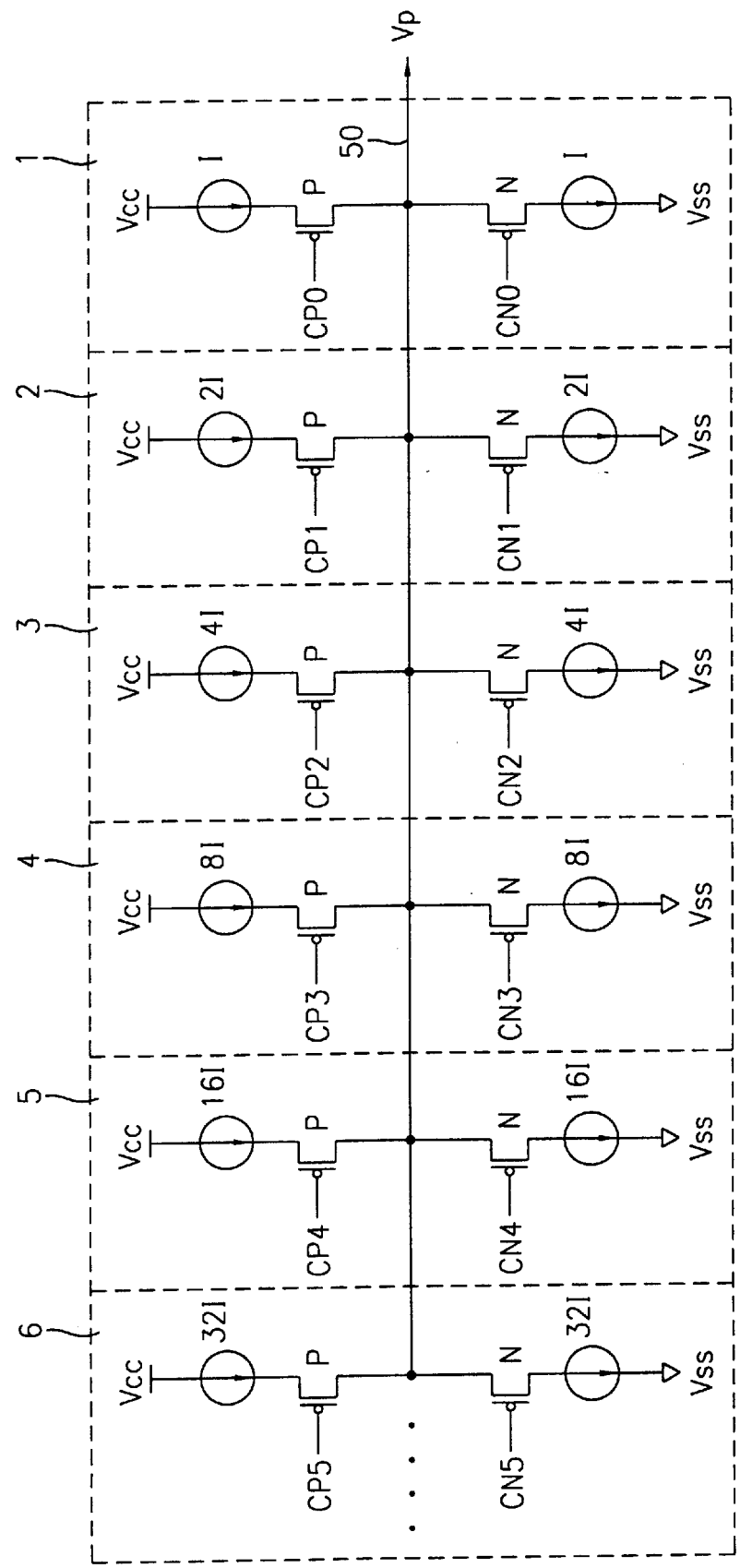
FIG. 4 is a detailed structure view illustrating a charge pump in FIG. 2.

As a result, as depicted in FIG. 4, the n pairs of pumps (1~n) are selectively driven by the control signal CPn or CNn, and thus a pumping voltage Vp with its gain controlled is outputted from the charge pump 22. The pumping voltage Vp is filtered in the loop filter 12, and then outputted as the control voltage CV to control an output frequency of the VCO 24. Accordingly, the output frequency of the VCO 24 is controlled by the control voltage CV, and thus the phase of the internal clock signal CLKI becomes identical to the phase of the external clock signal CLKX. That is to say, the PLL is locked.

When the PLL is locked, the loop gain sequence of the gear shifting control unit 21 becomes a constant number by the output signal from the phase detector 20, the charge pump 22 is identically operated, and thus the PLL keeps outputting the locked internal clock signal CLKI for the external clock signal CLKX.

As discussed earlier, the PLL according to the present invention controls the initial phase of the internal clock signal CLKI by the zero phase start unit 25, and also controls its loop gain by using the gear shifting control unit 21, thereby obtaining the internal clock signal CLKI locked to the external clock signal CLKX in a short time.

As described above, the PLL according to the present invention programs the variable loop gain sequence by using the gear shifting algorithm, and controls its loop gain according to the programmed variable loop gain sequence, which results in the short locking time and low jitter.

As the present invention may be embodied in several forms without departing from the spirit of essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A phase locked loop using a gear shifting algorithm, comprising:

a phase detector for comparing phases of first and second clock signals;

a gear shifting control unit for outputting a plurality of control signals according to a programmed variable loop gain sequence and an output signal from the phase detector;

a charge pump for controlling a loop gain of a pumping voltage according to the plurality of control signals;

a loop filter for filtering an output signal from the charge pump; and a voltage controlled oscillator for controlling a frequency of the second clock signal according to the output signal from the loop filter.

2. The phase locked loop according to claim 1, wherein the first clock signal is an external clock signal, and the second clock signal is an internal clock signal.

3. The phase locked loop according to claim 1, further comprising: a zero phase start unit for controlling an operation of the voltage controlled oscillator according to the first clock signal, and for controlling an initial phase of the second clock signal.

4. The phase locked loop according to claim 1, wherein the gear shifting control unit comprises:

a switching data generator for outputting the programmed variable loop gain sequence according to the first clock signal; and a combination logic for outputting first and second pluralities of control signals to control the charge pump by performing an operation of the loop gain sequence and first and second phase difference signals outputted from the charge pump.

5. The phase locked loop according to claim 4, wherein the switching data generator consists of a RAM.

6. The phase locked loop according to claim 4, wherein the first phase difference signal is generated when the phase of the second clock signal is slower than the phase of the first clock signal, and the second phase difference signal is generated when the phase of the second clock signal is faster than the phase of the first clock signal.

7. The phase locked loop according to claim 4, wherein the combination logic comprises:

a NAND gate for NANDing the first phase difference signal and the loop gain sequence; and an AND gate for ANDing the second phase difference signal and the loop gain sequence.

8. The phase locked loop according to claim 1, wherein the charge pump comprises n pairs of pumps selectively controlled according to a plurality of first and second control signals outputted from the gear shifting control unit, wherein each pair of pumps includes a first current source and a PMOS transistor connected in series between a power voltage and an output node; and a second current source and an NMOS transistor connected in series between the output node and a ground voltage, the first control signal being inputted into a gate of the PMOS transistor, the second control signal being inputted into a gate of the NMOS transistor.

9. The phase locked loop according to claim 8, wherein each pair of pumps has an identical current value, and a current source of a specific pair of pumps has a greater current value than that of a preceding pair of pumps by two times.

10. The phase locked loop according to claim 8, wherein the current source is a MOS transistor which is turned on.

11. A phase locked loop using a gear shifting algorithm, comprising:

a phase detector to compare phases of first and second clock signals;

a gear shifting control unit to output a plurality of control signals according to inputs of the first clock signal and an output signal from the phase detector;

a charge pump to control a loop gain of a pumping voltage according to the plurality of control signals;

a loop filter to filter an output signal from the charge pump; and a voltage controlled oscillator to control a frequency of the second clock signal according to the output signal from the loop filter.

12. The phase locked loop according to claim 11, wherein the gear shifting control unit includes:

a switching data generator to output a loop gain according to an input of the first clock signal; and a combination logic to output a plurality of control signals according to inputs of the loop gain and the output signal from the phase detector.

13. The phase locked loop according to claim 12, wherein the switching data generator consists of a RAM.

* * * * *